(12) United States Patent
Schmidt et al.

(10) Patent No.: US 11,142,683 B2
(45) Date of Patent: Oct. 12, 2021

(54) PHOSPHOR WITH HYBRID COATING AND METHOD OF PRODUCTION

(71) Applicant: KONINKLIJKE PHILIPS N.V., Eindhoven (NL)

(72) Inventors: Peter Josef Schmidt, Aachen (DE); Andreas Tücks, Aachen (DE); Baby Seriyati Schreinemacher, Aachen (DE)

(*) Notice: Subject to any disclaimer, the term of this patent is extended or adjusted under 35 U.S.C. 154(b) by 354 days.

(21) Appl. No.: 15/510,651

(22) PCT Filed: Sep. 10, 2015

(86) PCT No.: PCT/EP2015/070707
§ 371 (c)(1),
(2) Date: Mar. 10, 2017

(87) PCT Pub. No.: WO2016/041838
PCT Pub. Date: Mar. 24, 2016

(65) Prior Publication Data
US 2018/0230376 A1  Aug. 16, 2018

(30) Foreign Application Priority Data
Sep. 17, 2014 (EP) .................................. 14185078

(51) Int. Cl.
*C09K 11/02* (2006.01)
*C23C 16/455* (2006.01)
(Continued)

(52) U.S. Cl.
CPC ........ *C09K 11/025* (2013.01); *C09K 11/0883* (2013.01); *C09K 11/7734* (2013.01);
(Continued)

(58) Field of Classification Search
CPC .......................... C09K 11/025; C09K 11/7734
See application file for complete search history.

(56) References Cited

U.S. PATENT DOCUMENTS

| 5,309,069 A | 5/1994 | Sigai et al. |
| 7,400,085 B2 | 7/2008 | Hasegawa |

(Continued)

FOREIGN PATENT DOCUMENTS

| CN | 103725282 A | 4/2014 |
| CN | 103978203 A | 8/2014 |

(Continued)

OTHER PUBLICATIONS

Steckel et al., "Quantum Dots: The Ultimate Down-Conversion Material for LCD Displays," 2014, SID 2014 Digest, pp. 130-133. (Year: 2014).*

(Continued)

*Primary Examiner* — Robert A Vetere

(57) ABSTRACT

The invention provides a method for providing luminescent particles (100) with a hybrid coating, the method comprising (i) providing a first coating layer (110) onto the luminescent particles (100) by application of a sol-gel coating process, thereby providing coated luminescent particles; and (ii) providing a second coating layer (120) onto the coated luminescent particles by application of an atomic layer deposition process. The invention also provides luminescent particles (100) comprise a luminescent core (102), a first coating layer (110) having a first coating layer thickness (d1) in the range of 50-300 nm, and a second coating layer (120) having a second coating layer thickness (d2) in the range of 5-250 nm.

19 Claims, 6 Drawing Sheets

(51) Int. Cl.
*C09K 11/08* (2006.01)
*C09K 11/77* (2006.01)
*H01L 33/50* (2010.01)

(52) U.S. Cl.
CPC ...... *C23C 16/45529* (2013.01); *H01L 33/502* (2013.01); *H01L 2933/0041* (2013.01); *H01L 2933/0083* (2013.01)

(56) References Cited

U.S. PATENT DOCUMENTS

| | | | |
|---|---|---|---|
| 7,795,797 B2* | 9/2010 | Kondo | C09K 11/025 252/301.4 R |
| 8,287,637 B2 | 10/2012 | Carlini et al. | |
| 2004/0018382 A1* | 1/2004 | Kinlen | H05B 33/20 428/690 |
| 2004/0077182 A1* | 4/2004 | Lim | C23C 16/45542 438/785 |
| 2005/0277570 A1* | 12/2005 | Zukawa | H01J 61/44 510/467 |
| 2007/0125984 A1* | 6/2007 | Tian | C09K 11/025 252/301.4 S |
| 2007/0172580 A1* | 7/2007 | Fan | C09K 11/02 427/66 |
| 2007/0298250 A1* | 12/2007 | Weimer | C09K 11/025 428/336 |
| 2009/0246674 A1* | 10/2009 | Carlini | B82Y 30/00 430/110.2 |
| 2011/0068321 A1 | 3/2011 | Pickett et al. | |

FOREIGN PATENT DOCUMENTS

| | | |
|---|---|---|
| EP | 0432500 A2 | 6/1991 |
| JP | 2006052250 A | 2/2006 |
| JP | 2006265326 A | 10/2006 |
| JP | 2009526089 A | 7/2009 |
| JP | 2011515567 A | 5/2011 |
| TW | 200735416 A | 9/2007 |
| WO | 2012166855 A1 | 12/2012 |
| WO | 2013/175336 A1 | 11/2013 |
| WO | 2013171360 A1 | 11/2013 |
| WO | 2014128676 A1 | 8/2014 |
| WO | 2014/140936 A2 | 9/2014 |

OTHER PUBLICATIONS

CN First Office Action dated Nov. 30, 2018, China Patent Application No. 201580050374.7, 21 pages.
EPO as ISA, "International Search Report and Written Opinion" dated Dec. 17, 2015 from International Application No. PCT/EP2015/070707, filed Sep. 10, 2015, 11 pages.
Extended European Search Report dated Dec. 4, 2014, European Application No. 14185078.4, 6 pages.

* cited by examiner

PHOSPHOR WITH HYBRID COATING AND METHOD OF PRODUCTION

CROSS-REFERENCE TO RELATED APPLICATIONS

The present application is a § 371 application of International Application No. PCT/EP2015/070707 filed on Sep. 10, 2015 and entitled "PHOSPHOR WITH HYBRID COATING AND METHOD OF PRODUCTION", which claims the benefit of European Patent Application No. 14185078.4 filed on Sep. 17, 2014. International Application No. PCT/EP2015/070707 and European Patent Application No. 14185078.4 are incorporated herein.

FIELD OF THE INVENTION

The invention relates to a method for providing a coated luminescent material, to such luminescent material, as well as to a lighting device comprising such luminescent material for wavelength conversion.

BACKGROUND OF THE INVENTION

The coating of luminescent materials is known in the art. U.S. Pat. No. 5,309,069, for instance, describes a fluorescent lamp including an alkaline earth halophosphate (Cool-White) phosphor, e.g. a calcium halophosphate phosphor, having a continuous protective bilayer coating of alumina surrounding silica surrounding the phosphor particles. The lamp may be a high color rendition fluorescent lamp in which a first layer of alkaline earth halophosphate phosphor coats an inner surface of the lamp envelope, and a second layer of phosphor overlies the first layer of phosphor. The second layer of phosphor is a mixture of red, blue and green emitting phosphors, at least one of these being a zinc silicate phosphor. Each of the alkaline earth halophosphate and zinc silicate phosphors have a bilayer coating in which a coating of alumina surrounds a coating of silica which surrounds the phosphor.

WO2014128676 describes a coated luminescent particle, a luminescent converter element, a light source, a luminaire and a method of manufacturing coating luminescent particles are provided. The coated luminescent particle comprises a luminescent particle, a first coating layer and a second coating layer. The luminescent particle comprises luminescent material for absorbing light in a first spectral range and for converting the absorbed light towards light of a second spectral range. The luminescent material is sensitive for water. The first coating layer forms a first barrier for water and comprises a metal oxide or a nitride, phosphide, sulfide based coating. The second coating layer forms a second barrier for water and comprises a silicon based polymer or comprises a continuous layer of one of the materials $AlPO_4$, $SiO_2$, $Al_2O_3$, and $LaPO_4$. The first coating layer and the second coating layer are light transmitting. The first coating layer encapsulates the luminescent particle and the second coating layer encapsulates the luminescent particle with the first coating layer.

US2007125984 describes a photo luminescent phosphor coated with a coating of oxide, the phosphor comprising (1) an inorganic phosphor chosen from (a) a metal thiogallate phosphor and (b) a metal sulfide phosphor and (2) a coating that comprises at least one layer having at least one oxides. The coated photo luminescent phosphor of US2007125984 is alleged to be more resistant to water-induced degradation than when it is uncoated.

SUMMARY OF THE INVENTION

Moisture sensitive luminescent powder materials can be coated with a conformal layer of an amorphous or glassy material to reduce decomposition rates by moisture attack.

The coating may be applied by depositing a material at the particle surfaces by reacting a dissolved inorganic precursor in a suspension (e.g. by a sol-gel process) or by deposition from the gas phase (e.g. a chemical vapor deposition or an atomic layer deposition (ALD) process). Atomic layer deposition could be a suitable method to deposit thin, conformal coatings of various inorganic materials on powder particles. For instance, methods may be used to fluidize particles during the ALD coating process to improve the coating quality by preventing particle-particle agglomeration that leads to decreased coating quality. Many of the known coating processes have one or more disadvantages such as agglomeration, decrease in quantum efficiency of the coated luminescent material (relative to the uncoated material), or non-conformal coatings.

Hence, it is an aspect of the invention to provide an alternative coating process, which preferably further at least partly obviates one or more of above-described drawbacks.

It appeared that with a sol-gel coating process only the properties of the luminescent materials did not sufficiently improve. Further, it appeared that also with ALD the properties of the luminescent materials did not sufficiently improve. It surprisingly appeared that applying first a sol-gel coating layer and then providing an ALD coating layer, especially a relative thick sol-gel coating layer and a relative thin ALD coating layer, stability was enhanced considerably whereas the quantum efficiency of the luminescent materials was hardly affected or not affected. Hence, herein a hybrid coating method is provided for a luminescent powder material that consists of depositing a first coating layer by application of a sol-gel type process and a second layer by application of an ALD process, such as a static atomic layer deposition process, to obtain a uniformly coated, non-agglomerated powder. It was surprisingly found that the sol-gel primary coatings of the luminescent particles may improve the overall performance in many ways: a) the sol-gel primary coating leads to very clean particle surfaces because substantially all surface contaminating submicron particles that would reduce the ultrathin ALD film layer quality are removed from the surfaces during the coating process; b) the primary sol-gel coating seems to greatly improve particle flowability and reduces agglomerate formation; (c) the primary sol-gel coating can even improve the light extraction properties of the luminescent particles due to its "moth eye" (or "strawberry" or "pocked") patterned surface topology; (d) the primary sol-gel coating allows a fully conformal ALD second coating layer without agglomerate formation.

Hence, in a first aspect the invention provides a method for providing luminescent particles with a hybrid coating, the method comprising: (i) providing a first coating layer ("first coating" or "sol-gel coating" or "sol-gel coating layer") onto the luminescent particles by application of a sol-gel coating process, thereby providing coated luminescent particles; and (ii) providing a second coating layer ("second coating" or "ALD coating" or "ALD coating layer") onto the coated luminescent particles by application of an atomic layer deposition process, especially a method wherein the second coating layer comprises a multilayer with layers having different chemical compositions, and wherein in the atomic layer deposition process a metal oxide precursor is—amongst others—selected from the group of metal oxide precursors of metals selected from the group consisting of Al, Hf, Ta, Zr, Ti and Si.

In yet a further aspect, the invention also provides a luminescent material comprising the luminescent particles obtainable by such method. Especially, the invention provides in yet a further aspect a luminescent material comprising luminescent particles, wherein the luminescent particles comprise a luminescent core, a first coating layer ("sol-gel coating layer"), especially having a first coating layer thickness (d1) in the range of 5-500 nm, especially 10-500 nm, yet even more especially 5-500 nm, especially 10-500 nm, yet even more especially 20-500 nm, especially 50-300 nm, such as at least 100 nm, and a second coating layer ("ALD coating layer") especially having a second coating layer thickness (d2) in the range of 5-250 nm, such as especially 5-200 nm, yet even more especially wherein the second coating layer comprises a multilayer with layers having different chemical compositions, and wherein the multilayer comprises one or more layers comprising an oxide of one or more of Al, Hf, Ta, Zr, Ti and Si.

With such luminescent material, i.e. such luminescent material comprising these (hybrid coated) particles, a relative stable luminescent material is provided with quantum efficiencies close to or identical to the virgin (non-coated) luminescent material and having stabilities against water and/or (humid) air which are very high and superior to non-coated or non-hybrid coated luminescent particles.

Hence, the starting material is a particulate luminescent material or a luminescent material that is made particulate. The luminescent particles of the particulate luminescent material are coated as described herein. The term "luminescent particles" and similar terms indicate that the particles luminesce under excitation with especially UV and/or blue radiation (light source radiation, see below).

The first coating layer may optionally include a multilayer. However, the (multi-)layers of the first coating layer are all sol-gel layers. Therefore, the first layer is herein also indicated as sol-gel layer (thus optionally including a sol-gel multi-layer). The first coating layer especially comprises silicon oxide (especially $SiO_2$). An example of a multi-layer may e.g. include $SiO_2$—$Al_2O_3$ (sol-gel) multi-layer, such as a stack of three or more (sol-gel) layers wherein $SiO_2$ and $Al_2O_3$ alternate.

Likewise, the second coating layer may optionally include a multi-layer. However, the multi-layers of the second coating layer are all ALD layers. Therefore, the second layer is indicated as ALD layer (thus optionally including an ALD multi-layer). Especially, the second coating layer does comprise a multi-layer, see also below. Further, especially the second coating layer is provided on the first coating layer, without intermediate layers. Optionally, on the second coating layer, a further coating layer may be provided. The second coating layer especially at least includes one or more aluminum oxide (especially $Al_2O_3$) coating layers. Especially, both the first coating layer and the second coating layer independently comprise metal oxides, though optionally also hydroxides may be included in the one or more of these layers. Further, independently the first coating layer and the second coating layer may include mixed oxide layers. Further, the coating layers need not necessarily to be fully stoichiometric oxides, as is known in the art.

In general, the thickness of the first coating layer will be larger than the thickness of the second coating layer, such as at least 1.2, like at least 1.5, like at least 2 times larger, or even at least 4 times or at least 5 times larger. In a specific embodiment, the method of the invention comprises (i) providing the first coating layer having a first coating layer thickness (d1) in the range of especially 20-500 nm, such as at least 50 nm, even more especially 50-300 nm, such as at least 100 nm, onto the luminescent particles by application of said sol-gel coating process, thereby providing said coated luminescent particles; and (ii) providing the second coating layer having a second coating layer thickness (d2) in the range of especially 5-250 nm, such as 5-200 nm, especially at least 10 nm, even more especially 10-100 nm, such as 15-75 nm, yet more especially 15-50 nm, onto said coated luminescent particles by application of said atomic layer deposition process. Hence, as indicated above, the luminescent particles comprise in an embodiment a luminescent core, a first coating layer having a first coating layer thickness (d1) in the range of especially 5-500 nm, especially 10-500 nm, yet even more especially 20-500 nm, more especially 50-300 nm, such as at least 100 nm, and a second coating layer having a second coating layer thickness (d2) in the range of especially 5-250 nm, even more especially 15-50 nm, such as in the range of 15-35 nm. It appears that thicker first layers provide better results than thinner layers. Hence, especially the first coating layer has a first coating layer thickness of at least 50 nm, such as at least about 100 nm.

The luminescent particles of interest may in principle include each type of luminescent particles. However, especially of interest are those type of luminescent particles that may be less stable in air or water or a humid environment, such as e.g. (oxy)sulfides, (oxy)nitrides, etc. Hence, in an embodiment the luminescent particles comprise one or more of a nitride luminescent material, an oxynitride luminescent material, a halogenide luminescent material, an oxyhalogenide luminescent material, a sulfide luminescent material, and an oxysulfide luminescent material. Additionally or alternatively, the luminescent particles may comprise a selenide luminescent material. Hence, the term "luminescent particles" may also refer to a combination of particles of different types of luminescent materials.

In a specific embodiment, the luminescent particles may be selected from the following group of luminescent material systems: $MLiAl_3N_4$:Eu (M=Sr, Ba, Ca, Mg), $M_2SiO_4$:Eu (M=Ba, Sr, Ca), $MSe_{1-x}S_x$:Eu (M=Sr, Ca, Mg), $MSr_2S_4$:Eu (M=Sr, Ca), $M_2SiF_6$:Mn (M=Na, K, Rb), $MSiAlN_3$:Eu (M=Ca, Sr), $M_8Mg(SiO_4)_4Cl_2$:Eu (M=Ca, Sr), $M_3MgSi_2O_8$:Eu (M=Sr, Ba, Ca), $MSi_2O_2N_2$:Eu (M=Ba, Sr, Ca), $M_2Si_{5-x}Al_xO_xN_{8-x}$:Eu (M=Sr, Ca, Ba). However, other systems may also be of interested to protect by the hybrid coating. Also combinations of particles of two or more different luminescent materials may be applied, such as e.g. a green or a yellow luminescent material in combination with a red luminescent material.

Terms like "M=Sr, Ba, Ca, Mg" indicates, as known in the art, that M includes one or more of Sr, Ba, Ca, and Mg. For instance, referring to $MSiAlN_3$:Eu (M=Ca, Sr), this may refer by way of examples to $CaSiAlN_3$:Eu, or to $SrSiAlN_3$:Eu, or to $Ca_{0.8}Sr_{0.2}SiAlN_3$:Eu, etc. etc. Further, the formula "$MLiAl_3N_4$:Eu (M=Sr, Ba, Ca, Mg)," is equal to the formula $(Sr,Ba,Ca,Mg)LiAl_3N_4$:Eu. Likewise this applies to the other herein indicated formulas of inorganic luminescent materials.

In a further specific embodiment, the luminescent particles may be selected from the following group of luminescent material systems: $M_{1-x-y-z}Z_zA_aB_bC_cD_dE_eN_{4-n}$—$O_n$:$ES_x$,$RE_y$, with M=selected from the group consisting of Ca (calcium), Sr (strontium), and Ba (barium); Z selected from the group consisting of monovalent Na (sodium), K (potassium), and Rb (rubidium); A=selected from the group consisting of divalent Mg (magnesium), Mn (manganese), Zn (zinc), and Cd (cadmium) (especially, A=selected from the group consisting of divalent Mg (magnesium), Mn (manganese), and Zn (zinc), even more especially selected from the group consisting of divalent Mg (magnesium), Mn (manganese); B=selected from the group consisting of trivalent B (boron), Al (aluminum) and Ga (gallium); C=selected from the group consisting of tetravalent Si (silicon), Ge (germanium), Ti (titanium) and Hf (hafnium); D selected from the group consisting of monovalent Li (lithium), and Cu (copper); E selected for the group consisting of P (the element phosphor), V (vanadium), Nb (niobium), and Ta (tantalum); ES=selected from the group consisting of divalent Eu (europium), Sm (samarium) and ytterbium, especially selected from the group consisting of divalent Eu and Sm; RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \leq x \leq 0.2$; $0 \leq y \leq 0.2$; $0 < x+y \leq 0.4$; $0 \leq z < 1$; $0 \leq n \leq 0.5$; $0 \leq a \leq 4$ (such as $2 \leq a \leq 3$); $0 \leq b \leq 4$; $0 \leq c \leq 4$; $0 \leq d \leq 4$; $0 \leq e \leq 4$; $a+b+c+d+e=4$; and $2a+3b+4c+d+5e=10-y-n+z$. Especially, $z \leq 0.9$, such as $z \leq 0.5$. Further, especially $x+y+z \leq 0.2$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: $x=0.01$, $y=0.02$, $n=0$, $a=3$; then $6+3b+4c=10-0.02$; with $a+b+c=4$: $b=0.02$, $c=0.98$.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \leq b \leq 4$; $0 \leq c \leq 4$; $0 \leq d \leq 4$; $0 \leq e \leq 4$ are defined.

Assume a system like $SrMg_2Ga_2N_4$:Eu. Here, $a=2$, $b=2$, $c=d=e=y=z=n=0$. In such system, $2+2+0+0+0=4$ and $2*2+3*2+0+0+0=10-0-0+0=10$. Hence, both equations are complied with. Assume that 0.5 O is introduced. A system with 0.5 O can e.g. be obtained when 0.5 Ga—N is replaced by 0.5 Mg—O (which is a charge neutral replacement). This would result in $SrMg_{2.5}Ga_{1.5}N_{3.5}O_{0.5}$:Eu. Here, in such system $2.5+1.5+0+0+0=4$ and $2*2.5+3*1.5+0+0+0=10-0-0.5+0=9.5$. Hence, also here both equations are complied with.

As indicated above, in an advantageous embodiment $d>0$ and/or $z>0$, especially at least $d>0$. Especially, the phosphor comprises at least lithium.

In yet another embodiment, $2 \leq a \leq 3$, and especially also $d=0$, $e=0$ and $z=0$. In such instances, the phosphor is amongst others characterized by $a+b+c=4$; and $2a+3b+4c=10-y-n$.

In a further specific embodiment, which may be combined with the former embodiments $e=0$. In yet a further specific embodiment, which may be combined with the former embodiments, M is Ca and/or Sr.

Hence, in a specific embodiment, the phosphor has the formula $M(Ca$ and/or $Sr)_{1-x-y}Mg_aAl_bSi_cN_{4-n}O_n:ES_x,RE_y$ (I), with ES=selected from the group consisting of divalent Eu (europium) or Sm (samarium) or Yb (ytterbium); RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein $y/x<0.1$, especially $<0.01$, and $n \leq 0.1$, especially $<0.01$, even more especially $<0.001$, yet even more especially $<0.0001$. Hence, in this embodiment, substantially samarium and or europium containing phosphors are described. For instance, when divalent Eu is present, with $x=0.05$, and for instance y1 for Pr may be 0.001, and y2 for Tb may be 0.001, leading to an $y=y1+y2=0.002$. In such instance, $y/x=0.04$. Even more especially, $y=0$. However, as indicated elsewhere when Eu and Ce are applied, the ratio $y/x$ may be larger than 0.1.

The condition $0<x+y \leq 0.4$ indicates that M may be substituted with in total up to 40% of ES and/or RE. The condition "$0<x+y \leq 0.4$" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant (i.e. $Eu^{2+}$), the molar ratio between samarium and europium (Sm/Eu) is $<0.1$, especially $<0.01$, especially $<0.001$. The same applies when europium in combination with ytterbium would be applied. When europium is applied as divalent luminescent species or dopant, the molar ratio between ytterbium and europium (Yb/Eu) is $<0.1$, especially $<0.01$, especially $<0.001$. Would all three together be applied, then the same molar ratios might apply, i.e. ((Sm+Yb)/Eu) is $<0.1$, especially $<0.01$, especially $<0.001$.

Especially, x is in the range of 0.001-0.2 (i.e. $0.001 \leq x \leq 0.2$), like 0.002-0.2, such as 0.005-0.1, especially 0.005-0.08. Especially in the case of divalent Europium in the herein described systems, the molar percentage may be in the range of 0.1-5% ($0.001 \leq x \leq 0.05$), such as 0.2-5%, like 0.5-2%. For other luminescent ions, x may (but is not necessarily) in embodiments be equal to or larger than 1% (x equal to or larger than 0.01).

In a specific embodiment, the phosphor is selected from the group consisting of $(Sr,Ca)Mg_3SiN_4$:Eu, $(Sr,Ca)Mg_2Al_2N_4$:Eu, $(Sr,Ca)LiAl_3N_4$:Eu and $(Sr,Ca)Li_dMg_aAl_bN_4$:Eu, with a, b, d as defined above.

As also indicated herein, the notation "(Sr,Ca)", and similar notations with other elements, indicates that the M-positions are occupied with Sr and/or Ca cations (or other elements, respectively).

In a further specific embodiment the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu. Further (non-limiting) examples for such phosphors are e.g. $(Sr_{0.8}Ca_{0.2})_{0.995}LiAl_{2.91}Mg_{0.09}N_{3.91}O_{0.09}$:$Eu_{0.005}$; $(Sr_{0.9}Ca_{0.1})_{0.905}Na_{0.09}LiAl_3N_{3.91}O_{0.09}$:$Eu_{0.005}$; $(Sr_{0.8}Ca_{0.03}Ba_{0.17})_{0.989}LiAl_{2.99}Mg_{0.01}N_4$:$Ce_{0.01}$,$Eu_{0.001}$; $Ca_{0.995}LiAl_{2.995}Mg_{0.005}N_{3.995}O_{0.005}$:$Yb_{0.005}$ (YB(II)); $Na_{0.995}MgAl_3N_4$:$Eu_{0.005}$; $Na_{0.895}Ca_{0.1}Mg_{0.9}Li_{0.1}Al_3N_4$:$Eu_{0.005}$; $Sr_{0.99}LiMgAlSiN_4$:$Eu_{0.01}$; $Ca_{0.995}LiAl_{2.955}Mg_{0.045}N_{3.96}O_{0.04}$:$Ce_{0.005}$, $(Sr_{0.9}Ca_{0.1})_{0.998}Al_{1.99}Mg_{2.01}N_{3.99}O_{0.01}$:$Eu_{0.002}$; $(Sr_{0.9}Ba_{0.1})_{0.998}Al_{1.99}Mg_{2.01}N_{3.99}O_{0.01}$:$Eu_{0.002}$.

In a further specific embodiment, the phosphor is selected from the group consisting of $(Sr,Ca)Mg_3SiN_4$:Eu and $(Sr,Ca)Mg_2Al_2N_4$:Eu. In yet another specific embodiment, the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, and $BaMg_3SiN_4$:Eu. Especially, these phosphors, and even more especially (Sr,Ca)$Mg_3SiN_4$:Eu and (Sr,Ca)$Mg_2Al_2N_4$:Eu may be phosphors having good luminescent properties, amongst others in terms of spectral position and distribution of the luminescence.

Of especial interest are phosphors wherein the phosphor complies with $0 \leq x \leq 0.2$, $y/x<0.1$, M comprises at least Sr, $z \leq 0.1$, $a \leq 0.4$, $2.5 \leq b \leq 3.5$, B comprises at least Al, $c \leq 0.4$, $0.5 \leq d \leq 1.5$, D comprises at least Li, $e \leq 0.4$, $n \leq 0.1$, and wherein ES at least comprises Eu. Especially, $y+z \leq 0.1$. Further, especially $x+y+z \leq 0.2$. Further, especially a is close to 0 or zero. Further, especially b is about 3. Further, especially c is close to 0 or zero. Further, especially d is about 1. Further, especially e is close to 0 or zero. Further, especially n is close to 0 or zero. Further, especially y is close to 0 or zero. Especially good systems, in terms of quantum efficiency and hydrolysis stability are those with $z+d>0$, i.e. one or more of Na, K, Rb, Li and Cu(I) are available, especially at least Li, such as e.g. (Sr,Ca)$LiAl_3N_4$:Eu and (Sr,Ca)$Li_dMg_aAl_bN_4$:Eu, with a, b, d as defined above. In a further specific embodiment the phosphor is selected from the group consisting of $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu. Further phosphors of special interest are (Sr,Ca,Ba)(Li,Cu)(Al,B,Ga)$_3N_4$:Eu, which comprises as M ion at least Sr, as B ion at least Al, and as D ion at least Li.

Hence, in a specific embodiment, the luminescent particles comprise a luminescent material selected from the $SrLiAl_3N_4$:$Eu^{2+}$ class. The term "class" herein especially refers to a group of materials that have the same crystallographic structure(s). Further, the term "class" may also include partial substitutions of cations and/or anions. For instance, in some of the above-mentioned classes Al—O may partially be replaced by Si—N (or the other way around). Examples of the $SrLiAl_3N_4$:$Eu^{2+}$ class are provided above. However, other luminescent materials may thus also be possible.

Such luminescent particles may have a number averaged particle size selected from the range of 0.1-50 μm, such as in the range of 0.5-40 μm, such as especially in the range of 0.5-20 μm. Hence, the luminescent core may have dimensions such as at maximum about 500 μm, such as at maximum 100 μm, like at maximum about 50 μm, especially with the larger particles sizes, substantially only individual particles may be coated, leading thus to luminescent core dimensions in the order of 50 μm or smaller. Hence, the invention is direct to the coating of particles. The dimensions of the luminescent core may substantially be smaller when nanoparticles or quantum dots are used as basis for the particulate luminescent material. In such instance, the cores may be smaller than about 1 μm or substantially smaller (see also below for the dimensions of the QDs).

Alternatively or additionally, the luminescent particles include luminescent quantum dots. The term "quantum dot" or "luminescent quantum dot" may in embodiments also refer to a combination of different type of quantum dots, i.e. quantum dots that have different spectral properties. The QDs are herein also indicated as "wavelength converter nanoparticles" or "luminescent nanoparticles". The term "quantum dots" especially refer to quantum dots that luminesce in one or more of the UV, visible and IR (upon excitation with suitable radiation, such as UV radiation). The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) $LiAsSe_2$, $NaAsSe_2$ and $KAsSe_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, $CuInS_2$, $CuInSe_2$, CdTe, CdSe, CdSeTe, $AgInS_2$ and $AgInSe_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm.

The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle. Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials. The term "core-shell" may also refer to "core-shell-shell", etc., including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material. In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors.

Therefore, in an embodiment the luminescent particles comprises a luminescent material selected from the group consisting of luminescent quantum dots comprising one or more core materials selected from the group consisting of CdS, CdSe, ZnS, and ZnSe. Hence, in an embodiment the luminescent particles may also be selected from the group of luminescent nanoparticles such as quantum dots or quantum rods of composition MX (M=Cd, Zn, X=Se, S). Such particles may have a number averaged particle size (i.e. especially length/width/height, diameter), selected from the range of 1-50 nm.

As indicated above, the first coating layer that typically has an average thickness in the 5-500 nm, especially 10-500 nm, yet even more especially 20-500 nm, even more especially 50-300 nm range, is formed by a sol-gel type process. In such process, an inorganic network is formed from a homogeneous solution of precursors by subsequent hydrolysis to form a sol (colloidal suspension) and condensation to then form a gel (cross-linked solid network) that is chemically bonded to the powder surfaces. Preferably, the first coating material is silica and the sol-gel deposition method corresponds to the so-called Stöber reaction as described in Stöber, W., A. Fink, et al. "Controlled growth of monodisperse silica spheres in the micron size range." Journal of Colloid and Interface Science 26(1): 62-69. To this end the luminescent material is dispersed in an alcohol such as an aliphatic alcohol R—OH such as methanol $CH_3OH$, ethanol $C_2H_5OH$ or iso-propanol $C_3H_7OH$ followed by addition of ammonia ($NH_3$ solution in water) and a silicon alkoxide precursor. The silicon alkoxide precursor dissolves in the alcohol+ammonia mixture and starts to hydrolyze. A conformal silica coating is formed on top of the particle surfaces by reaction of the hydrolyzed, yet dissolved sol species with reactive groups of the particle surfaces (e.g. amine or silanol groups) followed by a seeded growth process that consists of hydrolysis, nucleation and condensation reactions steps.

The silicon alkoxide precursor is selected from a group of compounds that is formed by

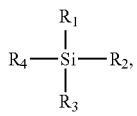

wherein a) R1, R2, R3 are hydrolysable alkoxy groups and R4 is selected from the group of C1-C6 linear alkyl groups, hydrolysable alkoxy groups and a phenyl group, or b) R1, R2, R3 are individually selected from —$OCH_3$ and —$OC_2H_5$ and R4 is selected from —$CH_3$, —$C_2H_5$, —$OCH_3$, —$OC_2H_5$ and a phenyl group. Optionally, the silicone based polymer is obtained from a material from the group of:

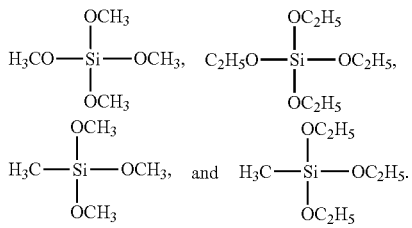

Hence, the silicon alkoxide precursor is selected from a group may be selected from this group. Especially, the silicon alkoxide precursor is selected from the group of $Si(OCH_3)_4$ or $Si(OC_2H_5)_4$, more especially $Si(OC_2H_5)_4$ is used as silicone alkoxide precursor. Similar precursors, but based on another metal such as e.g. Al may also be used.

A typical first coating process may comprise the following stages: (a) the luminescent powder is suspended in an alcohol—aqueous ammonia solution mixture while stirring or sonication. To improve particle dispersion, the powder can also first be mixed with alcohol and a small amount of a silicon (or other metal) alkoxide before the ammonia solution is added. (b) A silicon (or other metal) alkoxide precursor is added under agitation of the suspension. Typical concentrations of silicone (or other metal) alkoxide, ammonia and water in the alcohol solvent are 0.02-0.7, 0.3-1.5, and 1-16 mole/l, respectively. (c) The suspension is stirred or sonicated until the coating has formed. (d) The coated powder is washed with alcohol and dried followed by calcination in air or vacuum at 200-300° C.

Hence, in an embodiment the sol-gel coating process comprises: (ia) providing a mixture of an alcohol, ammonia, water, the luminescent particles and a metal alkoxide precursor while agitating the mixture, and allowing the first coating to be formed on the luminescent particles, wherein the metal alkoxide precursor is especially selected from the group consisting of an titanium alkoxide, a silicon alkoxide, and an aluminum alkoxide; and (ib) retrieving the luminescent particles from the mixture and optionally subjecting the luminescent particles to a heat treatment to provide said coated luminescent particles. The process of retrieving the (coated) luminescent materials from the mixture may e.g. include one or more of filtration, centrifuging, decanting (the liquid over a precipitate), etc. The heat treatment may include one or more of drying and calcination, especially both, i.e. e.g. a drying stage at a temperature in the range of 70-130° C. followed by a calcination stage (in air; or vacuum or an (other) inert atmosphere). Hence, during part of the time of the heat treatment, the (coated) luminescent may be in an inert environment, such as vacuum, or one or more of $N_2$ and a noble gas, etc. The heat treatment seems to improve the stability of the luminescent material. Further, as indicated above in the sol-gel coating process a silicon (or other metal; though the formula below refers to Si) alkoxide especially a precursor may be used selected from the group of compounds consisting of:

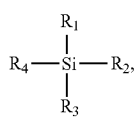

wherein R1, R2, R3 are selected from the group consisting of hydrolysable alkoxy moieties and R4 is selected from the group consisting of C1-C6 linear alkyl moieties, hydrolysable alkoxy moieties, and a phenyl moiety. Optionally other ligands than alkoxides may be applied in precursor for the sol-gel process.

The particles obtained with sol-gel coating process may optionally include more than one nucleus. For instance in the case of quantum dots, agglomerates with a sol-gel coating or first coating layer may be obtained. Hence, the silica precursor (or other metal oxide precursor) can also coat multiple QDs with thin single shells to form a coated agglomerate. This may amongst others depend upon the concentration of the quantum dots, etc.

Above, the precursors for the sol-gel coating are especially described in relation to a silicon alkoxide precursor. However, also aluminum (or another metal) alkoxide precursor(s) may be applied. Further, also a combination of two or more chemically different precursors may be applied for providing the sol-gel coating layer or first coating layer.

The term "first coating process" may also relate to a plurality of first coating processes. With a plurality of first coating processes one may provide a (multi-)layer substantially comprising the same composition through the entire layer thickness (when e.g. in the first coating process each coating stage or step includes depositing substantially the same material), or may provide a multi-layer with two or more layers having different compositions, such as a stack of two or more (sol-gel) layers with two or more different compositions, respectively. An example may e.g. be a $SiO_2$—$Al_2O_3$ (sol-gel) multi-layer, such as a stack of three or more (sol-gel) layers wherein $SiO_2$ and $Al_2O_3$ alternate (see also above).

As indicated above, the second coating layer may typically have a layer thickness in the 5-250 nm, especially 15-75 nm range. The layer may be formed by an atomic layer deposition type process. In such process a polymeric network is formed by reaction of a metal oxide precursor with an oxygen source such as water and/or ozon in the gas phase. Unlike in the sol-gel process the ALD reaction is splitted in (at least) two parts. In a first step the metal (oxide)

precursor is fed into a(n ALD) reactor and adsorbs and/or reacts with reactive groups on the particle surfaces and substantially all non-reacted or adsorbed precursor molecules are removed by reactor purging. In a second step the oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) because of the self-limiting nature of the surface reaction. These atomic layer reaction steps are repeated multiple times to form the final ALD coating. The term metal oxide precursor especially indicates a precursor of the metal oxide. The precursor itself may not be a metal oxide, but may e.g. include metal organic molecule. Hence, especially the metal (oxide) precursors for ALD may typically include metal halides, alkoxides, amides, and other metal (organic) compounds.

The step by step nature of the ALD process allows to easily deposit defined layer thicknesses. The ALD process further allows it to deposit layers of different composition by consecutively feeding different metal oxide precursor into the reactor to form multicomponent layers or nanolaminates. Hence, in a specific embodiment the second layer comprises a multi layer (see also below).

For the ALD process, amongst others a fluidized bed reactor may be applied.

Hence, in a specific embodiment the second coating layer is provided by application of said atomic layer deposition process. In an embodiment, a static powder bed is used for ALD coating of the sol-gel coated luminescent powder particles. However, also a fluidized bed may be applied. Other type of reactors may also be applied. Particle agglomeration may substantially be prevented by applying a first sol-gel coating with a structured, nanoporous surface. The process can easily scaled up and nearly no powder loss during ALD coating is observed. Commercially available ALD reactors for powder coating are e.g. sold by Picosun Oy with e.g. a cartridge sample holder (POCA™). A system that may be used for ALD is e.g. described in WO 2013171360 A1, though other systems may also be applied.

A (non-limited) number of suitable materials for the ALD second coating layer are listed in the following table:

| Oxide material | Metal (oxide_precursor) | Oxygen source | Deposition T [° C.] |
|---|---|---|---|
| $Al_2O_3$ | $Al(CH_3)_3$ (TMA) or $HAl(CH_3)_2$ | $H_2O$ or $O_3$ | 100-400 |
| $HfO_2$ | $Hf(N(CH_3)_2)_4$ or $Hf(N(CH_2CH_3)_2)_4$ | $H_2O$ | 80-300 |
| $Ta_2O_5$ | $TaCl_5$ or $Ta(N(CH_3)_2)_5$ | $H_2O$ | 80-300 |
| $ZrO_2$ | $ZrCl_4$ or $Zr(N(CH_3)_2)_4$ | $H_2O$ | 80-300 |
| $TiO_2$ | $TiCl_4$, $Ti(OCH_3)_4$ or $Ti(OEt)_4$ | $H_2O$ | 80-300 |
| $SiO_2$ | $SiCl_4$, $H_2N(CH_2)_3Si(OEt)_3$ or $Si(OEt)_4$ | $H_2O$ or $O_3$ | 150-300 |

Alternatively or additionally, niobium oxide (especially $Nb_2O_5$) or yttrium oxide ($Y_2O_3$) may be applied. Metal precursors thereof are e.g., tert-butylimido)-tris(diethylamino)-niobium, $NbF_5$, or $NbCl_5$, and Tris(ethylcyclopentadienyl) Yttrium, respectively.

However, other materials may also be applied. Hence, in the atomic layer deposition process a metal oxide precursor may especially be selected from the group of metal oxide precursors of metals selected from the group consisting of Al, Hf, Ta, Zr, Ti and Si. Alternatively or additionally, one or more of Ga, Ge, V and Nb may be applied. Even more especially, alternating layers of two or more of these precursors are applied, wherein at least one precursor is selected from the group consisting of an Al metal oxide precursor and an Si metal oxide precursor, especially an Al metal oxide precursor, and another precursor is selected from the group consisting of a Hf metal oxide precursor, a Ta metal oxide precursor, a Zr metal oxide precursor and a Ti metal oxide precursor, especially selected from the group consisting of a Hf metal oxide precursor, a Ta metal oxide precursor, and a Zr metal oxide precursor, even more especially a Ta metal oxide precursor. Especially Hf, Zr, and Ta appear to provide relatively light transmissive layers, whereas Ti, for instance, may provide relatively less light transmissive layers. Processing with Ta, Hf and Zr seems to be relatively easier than Si, for instance. The terms "oxide precursor" or "metal oxide precursor" or "metal (oxide) precursor" may also refer to a combination of two or more chemically different precursors. These precursors especially form an oxide upon reaction with the oxygen source (and are therefore indicated as metal oxide precursor).

For instance, silanol groups (assuming a silica first coating layer) at the nanoporous surface of the sol-gel first coating layer act as reactive sites during ALD of the initial layers. In an embodiment, alumina is deposited by using $Al(CH_3)_3$ (TMA) as metal oxide precursor and (subsequently exposure to) water as the oxygen source. In the first reaction step, TMA reacts with surface silanol groups of the silica sol gel layer according to:

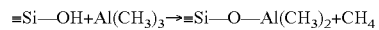

Water then reacts in the second reaction step with the metal oxide precursor by hydrolysis followed by condensation reactions:

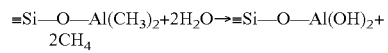

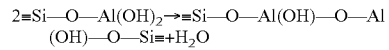

It turned out that deposition temperatures in the 200-350° C. range are most suitable for alumina ALD on the first coating layer, preferably the temperature is in the 250-300° C. range. Similar temperatures may be applied for ALD of other metal oxide precursors for the ALD layer(s).

Especially, the ALD alumina (or other metal oxide) layer has a thickness of 5-120 nm, more especially a thickness of 10-75 nm, yet even more especially a thickness in the 15-50 nm range.

Water gas penetration barrier properties of alumina ALD layers can be further improved by depositing at least one additional layer of a different oxide material such as $ZrO_2$, $TiO_2$, $Y_2O_3$, $Nb_2O_5$, $HfO_2$, $Ta_2O_5$. Especially, the thickness of the additional material layer is in the range 1-40 nm, more preferably in the range 1-10 nm. Even more preferred are nanolaminate stacks of alternating layers of $Al_2O_3$ and a second oxide material from the group of $ZrO_2$, $TiO_2$, $Y_2O_3$, $Nb_2O_5$, $HfO_2$, $Ta_2O_5$. A suitable nanolaminate stack may be e.g. 20×(1 nm $Al_2O_3$ (10 ALD cycles)+1 nm $ZrO_2$ (11 ALD cycles)) deposited at 250° C. to form a 40 nm thick nanolaminated $2^{nd}$ coating on top of the first sol-gel coating.

The invention especially provides in an embodiment a method wherein the second coating layer comprises a multilayer with layers having different chemical compositions, and wherein in the atomic layer deposition process a metal oxide precursor is—amongst others—selected from the group of metal oxide precursors of metals selected from the group consisting of Al, Hf, Ta, Zr, Ti, Si, Ga, Ge, V and Nb, especially the metal oxide precursor is selected from the group of metal oxide precursors of metals selected from the group consisting of the Al, Hf, Ta, Zr, Ti and Si. Also combinations of two or more of such precursors may be used, e.g. a multilayer comprising alumina—a mixoxide of zirconium and hafnium—alumina, etc.

Hence, in an embodiment the second coating layer may comprise a multilayer with layers having different chemical compositions, and wherein the multilayer comprises one or more layers comprising an oxide of one or more of Al, Hf, Ta, Zr, Ti, Si, Ga, Ge, V, and Nb, especially wherein the multilayer comprises one or more layers comprising an oxide of one or more of Al, Hf, Ta, Zr, Ti and Si. One or more layers of such multi-layers may also include mixoxides, such as indicated above.

Especially the method is applied such that a(n ALD) multi-layer coating is obtained including at least two (ALD) layers ("AB"), even more especially at least three layers (e.g. "ABA"), yet even more at least four layers. Yet more especially, at least a stack comprising two or more stack of subsets of two (ALD) layers ("AB") is applied, such as $(AB)_n$, wherein n is 2 or more, such as 2-20, like 2-10.

Especially, at least one of the layers of the multi-layer comprises one or more of an oxide of Al and Si (including a combination thereof), and at least one of the layers of the multi-layer comprises one or more of an oxide of Hf, Ta, Zr, Ti, Ga, Ge, V, and Nb. Such layer may optionally also include Al, Hf, Ta, Zr, Ti, Si, Ga, Ge, V, and Nb, wherein Si or Al are in a layer together with one or more of the other indicated elements, when the other layer(s) of the multi-layer comprise an oxide of silica or alumina, respectively. The term "ALD multi-layer" or "multi-layer" as indicated above especially refers to layers having different chemical compositions. The phrase "layers having different chemical compositions" indicates that there are at least two layers having different chemical compositions, such as in the case of "ABC", or in the case of $(AB)_n$.

Specific examples of $(AB)_n$ include multi-layers wherein A is selected from one or more of an oxide of Si and Al, especially Al, and wherein B is selected from one or more of an oxide of Al, Hf, Ta, Zr, Ti, Si, Ga, Ge, V, and Nb, wherein Si or Al are in a layer together with one or more of the other indicated elements, when the other layer(s) of the multi-layer comprise an oxide of silica or alumina, respectively, especially wherein B is selected from one or more of an oxide of Hf, Ta, Zr, Ti, Ga, Ge, V, and Nb, yet even more especially wherein B is selected from one or more of an oxide of Hf, Ta, Zr, and Ti, more especially wherein B is selected from one or more of an oxide of Hf, Ta, and Zr.

This ALD multi-layer is thus especially provided on the sol-gel layer. Further, as indicated above, on top of the ALD multi-layer, optionally one or more further layers may be applied.

Hence, in a specific embodiment the second coating layer comprises a multi-layer with a stack of layers, with adjacent layers having different chemical compositions. Especially, the layers of the multi layer have each independently thicknesses in the range of 1-40 nm, especially 1-10 nm. Further, especially, the multi-layer comprises one or more alumina layers and one or more metal oxide layers, with the metal selected from the group of Hf, Ta, Zr and Ti.

Therefore, in a specific embodiment in the atomic layer deposition process a metal oxide precursor selected from the group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]_4$, $TaCl_5$, $Ta(N(CH_3)_2)_5$, $Ta\{[N(CH_3)(CH_2CH_3)]_3N(C(CH_3)_3)\}$, $ZrCl_4$, $Zr(N(CH_3)_2)_4$, $TiCl_4$, $Ti(OCH_3)_4$, $Ti(OCH_2CH_3)_4$, $SiCl_4$, $H_2N(CH_2)_3Si(OCH_2CH_3)_3$, and $Si(OCH_2CH_3)_4$, and an oxygen source selected from the group consisting of $H_2O$ and $O_3$ are applied. As indicated above, also two or more different metal oxide precursors and/or two or more different oxygen sources may be applied.

Further, in yet an embodiment of the method in the atomic layer deposition process a multi-layer is provided, with layers having different chemical compositions, wherein one or more layers comprise tantalum oxide (especially $Ta_2O_5$). Hence, the invention also provides in an embodiment luminescent material, wherein the second coating layer comprises a multilayer with layers having different chemical compositions, wherein one or more layers may especially comprise $Ta_2O_5$. Further, in an embodiment of the method in the atomic layer deposition process a multi-layer is provided, with layers having different chemical compositions, wherein one or more layers comprise one or more of tantalum oxide (especially $Ta_2O_5$), hafnium oxide and zirconium oxide. Hence, the invention also provides in an embodiment luminescent material, wherein the second coating layer comprises a multilayer with layers having different chemical compositions, wherein one or more layers may especially comprise one or more of tantalum oxide, hafnium oxide and zirconium oxide. For instance, the multilayer stack may also include an stack with alternating layers wherein e.g. alumina alternates with one or more of tantalum oxide (especially $Ta_2O_5$), hafnium oxide and zirconium oxide, such as a stack comprising e.g. alumina-tantalum oxide-alumina-Hafnia-alumina-tantalum oxide etc.

Further, it appeared that when first an ALD coating was provided on the luminescent material particles (thus when e.g. preceding a subsequent the sol-gel layer) the ALD layer was less uniform than desirable. Hence, to obtain a good ALD layer, the ALD layer thickness may have to be increased more than in principle would be necessary, which may lead to an unnecessary reduction in transmission (even though in some cases small). Further, it appeared that an ALD coating coats more easily to a sol-gel obtained coating, whereas a sol-gel coating may less easily coat to an ALD coating. Further, a sol-gel process on an ALD layer might be harmful for the ALD layer.

The use of a final layer, i.e. a layer further away of the luminescent core comprising a metal oxide layer, with the metal selected from the group of Hf, Ta, Zr and Ti, seems especially beneficial in terms of stability. Further, using thin individual layers, such as thinner than about 10 nm, such as at least 5 nm, like at least 1 nm, also seems to add to the stability of the luminescent material.

Hence, the total layer thickness of the second coating layer is especially in the range of 5-250 nm, such as 10-200 nm, especially like 15-120 nm, such as 15-50 nm, like 20-75 nm.

When a non-oxide luminescent material is applied, during and/or before the method of the invention, i.e. especially the first coating process, an oxygen containing layer may be formed on the particles of the luminescent materials, leading to an intermediate oxygen containing layer between the core and the first coating layer. Hence, in a further embodiment the luminescent core comprises a non-oxide, and there is an intermediate oxide layer between the luminescent core and the first coating layer. The thickness of this intermediate layer may be in the range of 0.5-50 nm, such as 1-20 nm.

The layer thicknesses described herein are especially average layer thicknesses. However, especially at least 50%, even more especially at least 80%, of the area of the respective layers have such indicated layer thickness. Especially this indicates that under at least 50% of the area of such layer, such thickness will be found.

The first coating layer and the second coating layer are light transmitting which means that at least a portion of the light, which impinges on the respective layers, is transmitted through the respective layer. Thus, the first layer and the second layer may be fully or partially transparent, or may be translucent. In an embodiment, more than 90% of the (visible) light which impinges on the coating layers is transmitted through the coating layers. The first coating layer and/or the second coating layer may be light transmitting because of characteristics of the materials of which the coating layers are made. For example, the coating layer may be made from a material which is transparent, even if the layer is relatively thick. In another embodiment, the first coating layer and/or the second coating layer is thin enough such that the respective layer becomes light transmitting while the material of which the layer is manufactured is not transparent or translucent when manufactured in relatively thick layers. The materials described herein are all transmissive for (visible) light or can be made in suitable layer thicknesses that are transmissive for (visible) light.

In a further aspect, the invention also provides a lighting device comprising a light source configured to generate light source radiation, especially one or more of blue and UV, and a wavelength converter comprising the luminescent material as described herein, wherein the wavelength converter is configured to convert at least part of the light source radiation into wavelength converter light (such as one or more of green, yellow, orange and red light). The wavelength converter is especially radiationally coupled to the light source. The term "radiationally coupled" especially means that the light source and the luminescent material are associated with each other so that at least part of the radiation emitted by the light source is received by the luminescent material (and at least partly converted into luminescence). Hence, the luminescent cores of the particles can be excited by the light source radiation providing luminescence of the luminescent material in the core. In an embodiment, the wavelength converter comprises a matrix (material) comprising the luminescent material (particles). For instance, the matrix (material) may comprise one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). Alternatively or additionally, the matrix (material) may comprise an epoxy resin.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Especially, the light source is a light source that during operation emits (light source radiation) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light. In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL. In an embodiment, the light source may also provide light source radiation having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source radiation with a correlated color temperature in the range of 5000-20000 K, even more especially in the range of 6000-20000 K, such as 8000-20000 K. An advantage of the relative high color temperature may be that there may be a relative high blue component in the light source radiation.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1:
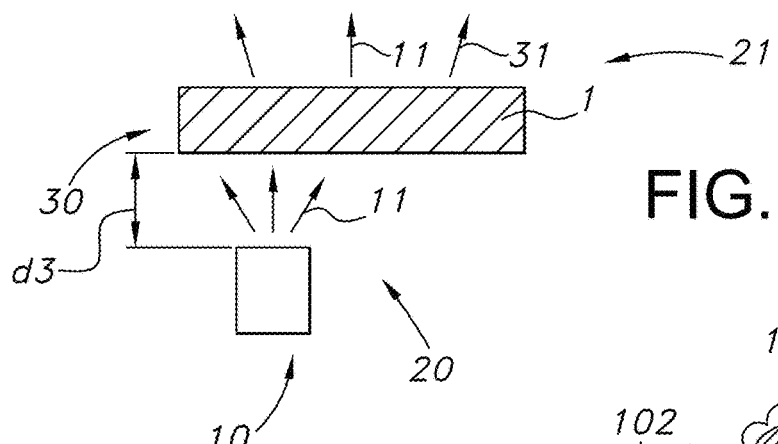
FIG. 1 schematically depicts a lighting device.

FIG. 1 schematically depicts a lighting device 20 comprising a light source 10 configured to generate light source radiation 11, especially one or more of blue and UV, as well as a wavelength converter 30 comprising the luminescent material 1 with particles as defined herein. The wavelength converter 30 may e.g. comprise a matrix, such as a silicone or organic polymer matrix, with the coated particles embedded therein. The wavelength converter 30 is configured to (wavelength) convert at least part of the light source radiation 11 into wavelength converter light 21, which at least comprises wavelength converter light 31 and optionally also light source radiation 11. The wavelength converter light 31 at least includes luminescence from the herein described coated particles. However, the wavelength converter 30 may optionally include also one or more other luminescent materials. The wavelength converter 30, or more especially the luminescent material 1, may be arranged at a non-zero distance d3, such as at a distance of 0.1-100 mm. However, optionally the distance may be zero, such as e.g. when the luminescent material is embedded in a dome on a LED die. The distance d3 is the shortest distance between a light emitting surface of the light source, such as a LED die, and the wavelength converter 30, more especially the luminescent material 1.

Figure 2A:
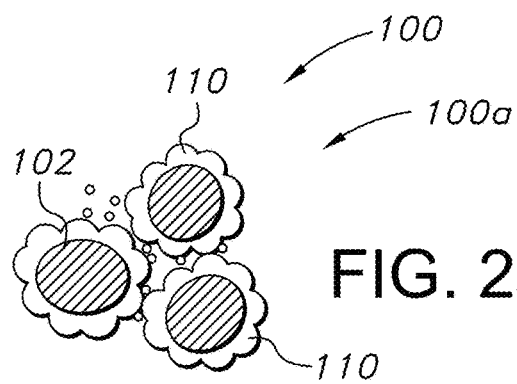
FIG. 2a schematically depicts luminescent powder particles having a sol-gel first coating.

FIG. 2a schematically depicts luminescent powder particles having a sol-gel first coating forming a static powder bed during ALD of a second coating. The particles are indicated with references 100 and the sol-gel coating or first coating layer is indicated with reference 110. The luminescent cores are indicated with reference 102, and may include e.g. micrometer dimensional particles of a luminescent nitride or sulfide phosphor, but may also include other (smaller) material such as luminescent nanoparticles (see further FIG. 2c). As schematically shown in FIG. 2a, the outer shape of the first coating layer 110 may have a somewhat pocked shape, as was found in SEM (see further FIG. 3b). By way of example, the smaller particles in FIG. 2a indicate e.g. ALD precursor (see further below). Reference 100a is used to indicate the luminescent particles 100 only having the sol-gel first coating layer 110.

Figure 2B:
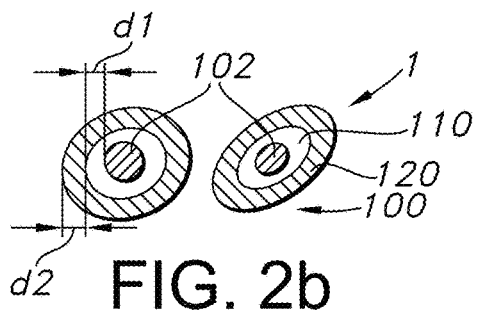
FIGS. 2b-2d schematically depict some further aspects of the particulate luminescent material.
Figure 2C:
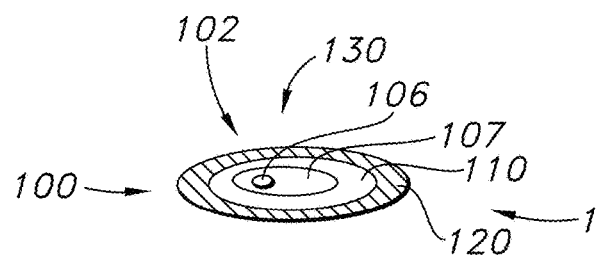
Figure 2D:
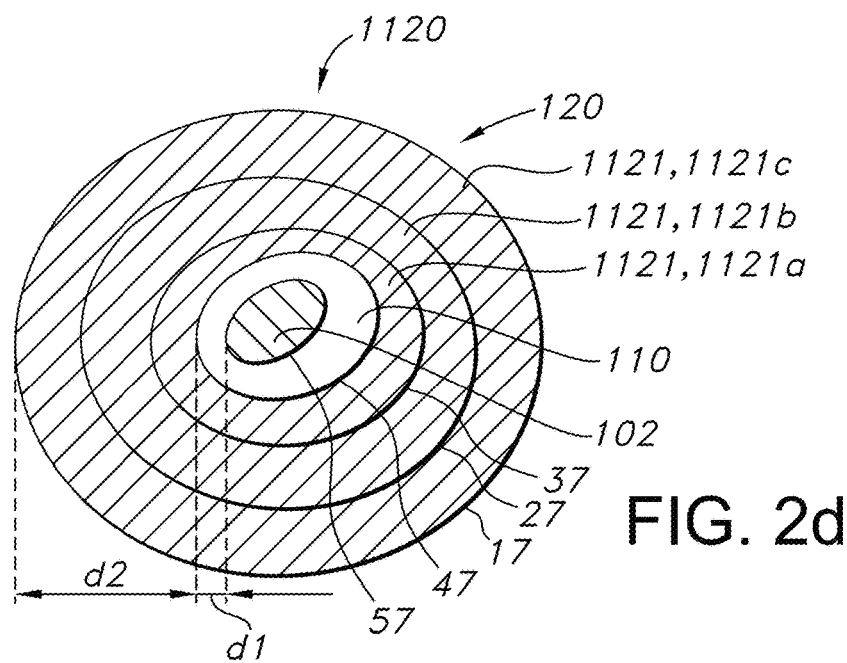

FIGS. 2b-2d schematically depict some further aspects of the particulate luminescent material; FIG. 2b shows a luminescent material 1, here by way of example two particles with luminescent cores 102, and a first coating layer 110 (formed by sol-gel coating), having a thickness d1, and a second coating layer 120 (formed by ALD), having a thickness d2. The thicknesses are not necessarily on scale. The possible identations in the first coating layer 110 are not depicted. The thickness d1 may especially be a mean thickness, averaged over the first coating layer 110; likewise this may apply to the second thickness d2, etc. (see also below).

FIG. 2c schematically depicts an embodiment wherein the luminescent core 102 includes a luminescent nanoparticle, here by way of example a quantum dot 130. The quantum dot in this example comprises a quantum rod with a (semiconductor) core material 106, such as ZnSe, and a shell 107, such as ZnS. Of course, other luminescent nanoparticles may also be used. Such luminescent quantum dot 130 can also be provided with the hybrid coating.

As indicated above, the coating layer may include multilayers; especially the second coating layer 120 may include a multi-layer coating. This is schematically shown in FIG. 2d, wherein the second coating layer 120 comprises an ALD multi-layer 1120, with layers 1121. References 1121a, 1121b and 1121c schematically indicate the individual layers, which may e.g. alternating $Al_2O_3$ layers (by way of example 1121b) and $Ta_2O_5$ layers (by way of example 1121a,1121c), respectively. Reference d2 indicates the thickness of the entire second coating layer 120. The individual ALD layers may e.g. have thicknesses in the range of 0.5-20 nm.

FIG. 2d indicates with references 17, 27, 37, 47 and 57 the surfaces of the respective layers. As indicated above, the layer thicknesses described herein are especially average layer thicknesses. Especially at least 50%, even more especially at least 80%, of the area of the respective layers have such indicated layer thickness. Hence, referring to the thickness d2 between surface 17 and surface 47, below at least 50% of surface 17, a layer thickness in the range of e.g. 5-250 nm may be found, with the other less than at least 50% of the surface area 17 e.g. smaller or larger thicknesses may be found, but in average d2 of the second coating (multi-) layer 120 is in the indicated range of 5-250. Likewise, this may apply to the other herein indicated thicknesses. For instance, referring to the thickness d1 between surface 47 and surface 57, this thickness may over at least 50% of the area of 47 be in the range of 20-500 nm, with the other less than at least 50% of the surface area 47 e.g. smaller or larger thicknesses may be found, but in average d1 of the first layer 110 is in the indicated range of 5-500 nm, such as especially 20-500.

FIGS. 2a-2d schematically depict luminescent particles 100 having a single nucleus. However, optionally also aggregates encapsulated with the first and the second coating layer may be formed. This may especially apply for quantum dots as luminescent cores.

Figure 3A:
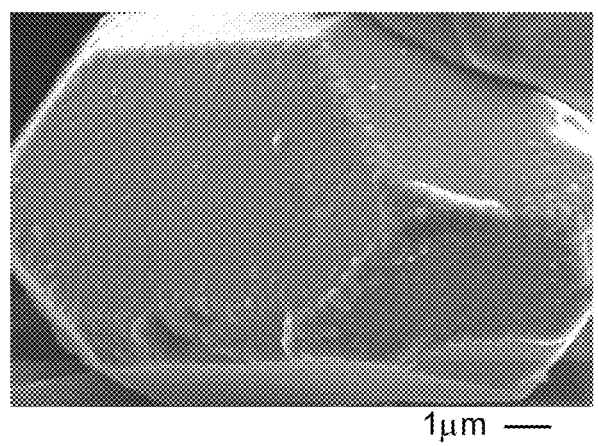
FIGS. 3a-3b show SEM images of $SiO_2$ coated powder after drying showing the surface structure of a single grain.
Figure 3B:
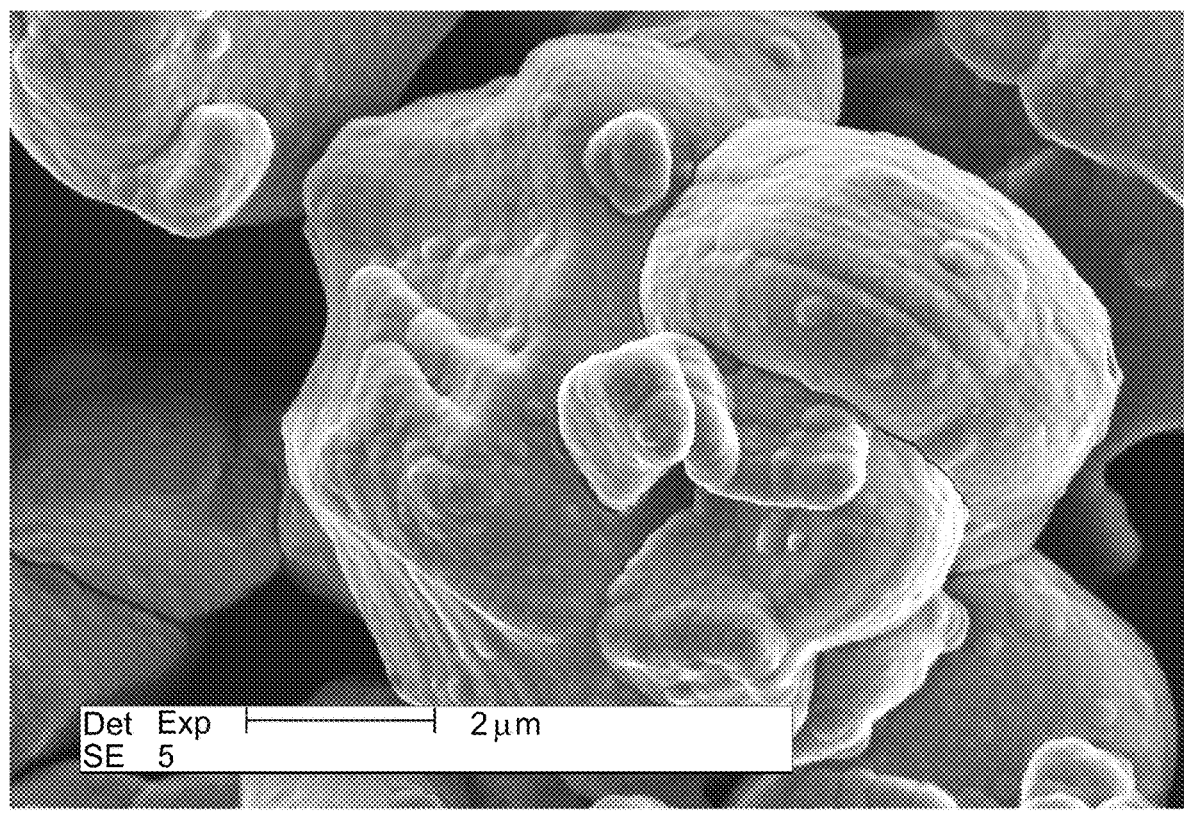
Figure 3C:
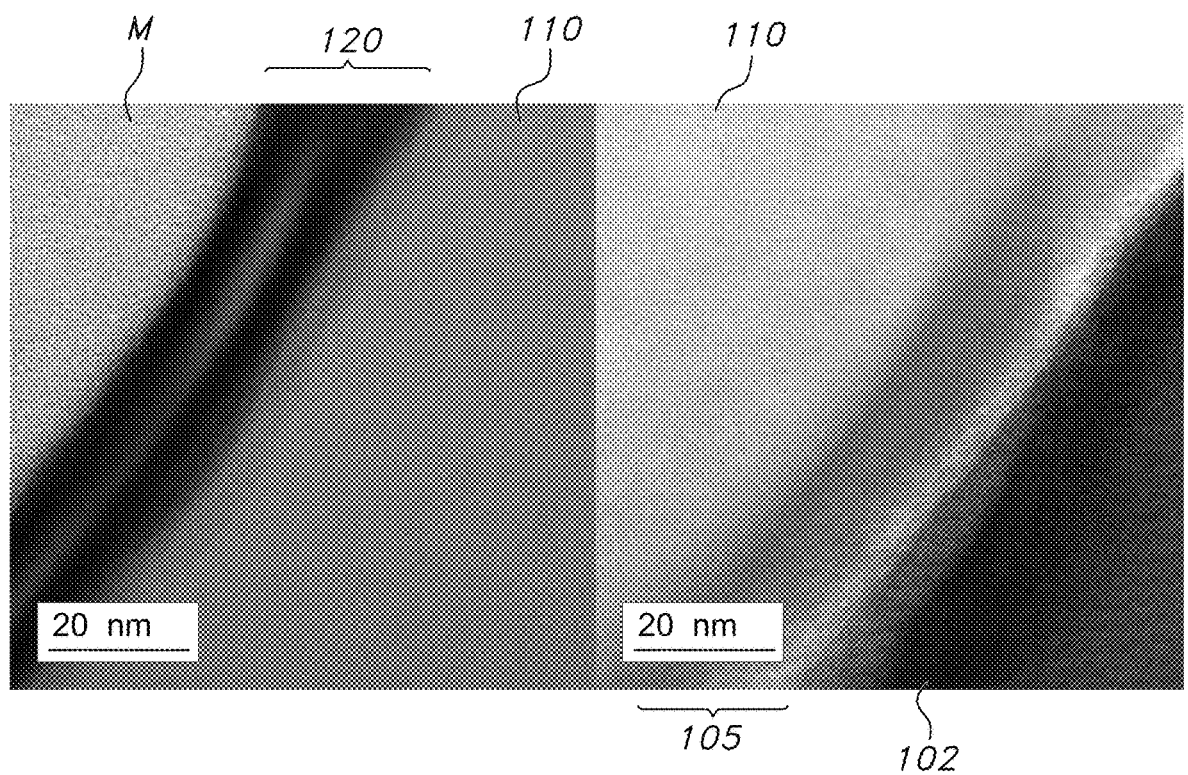
FIG. 3c show TEM pictures of a hybrid coated particle.

FIGS. 3a-3b show SEM images of $SiO_2$ coated powder after drying showing the surface structure of a single grain, with especially FIG. 3b, measured with a SEM with a higher resolution, showing the pocked surface, which is herein also indicated as "moth-eye". FIG. 3c show TEM pictures of a hybrid coated particle. Reference M in the left figure indicates a TEM matrix wherein the particles are embedded, such as a resin, for the purpose of TEM measurements. Reference 120 indicates a multi-layer second coating layer, here a 3-layer multi-layer on the first coating layer 110. In the right TEM figure it can be seen that there is an transition layer or intermediate layer 105 between the luminescent core 102 and the first coating layer 110. Here, a non-oxidic luminescent material was applied. The intermediate layer is an oxide layer (i.e. oxide formation at the surface of the non-oxidic luminescent material, such as a nitride luminescent material).

Figure 4A:
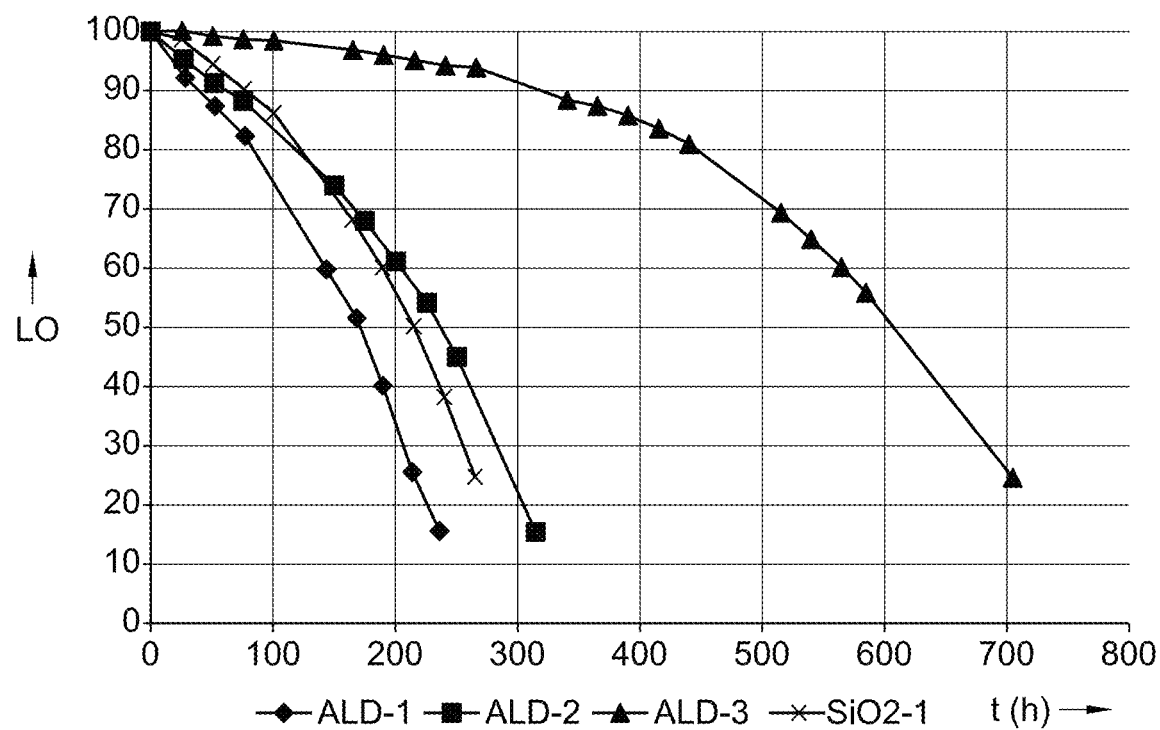
FIG. 4a shows the relative light output (LO) as a function of degradation time (in hours) for phosphor powder before ($SiO_2$ only) and after ALD coating ($Al_2O_3$ on $SiO_2$); degradation conditions: 60° C./100% relative humidity: ALD-1: 20 nm $Al_2O_3$ on phosphor; ALD-2: 40 nm $Al_2O_3$ on phosphor; ALD-3: 20 nm $Al_2O_3$ deposited on $SiO_2$ coating; $SiO_2$-1: sol-gel $SiO_2$ coating on phosphor (basis of ALD-3)

FIG. 4a shows the relative light output as a function of degradation time (in hours) for phosphor powder before ($SiO_2$ only) and after ALD coating ($Al_2O_3$ on $SiO_2$); degradation conditions: 60° C./100% relative humidity: ALD-1: 20 nm $Al_2O_3$ on phosphor; ALD-2: 40 nm $Al_2O_3$ on phosphor; ALD-3 20 nm $Al_2O_3$ deposited on $SiO_2$ coating; $SiO_2$-1: sol-gel $SiO_2$ coating on phosphor (basis of ALD-3). It is clear that only sol-gel coated material or only ALD coated material is inferior to the hybrid coating.

Figure 4B:
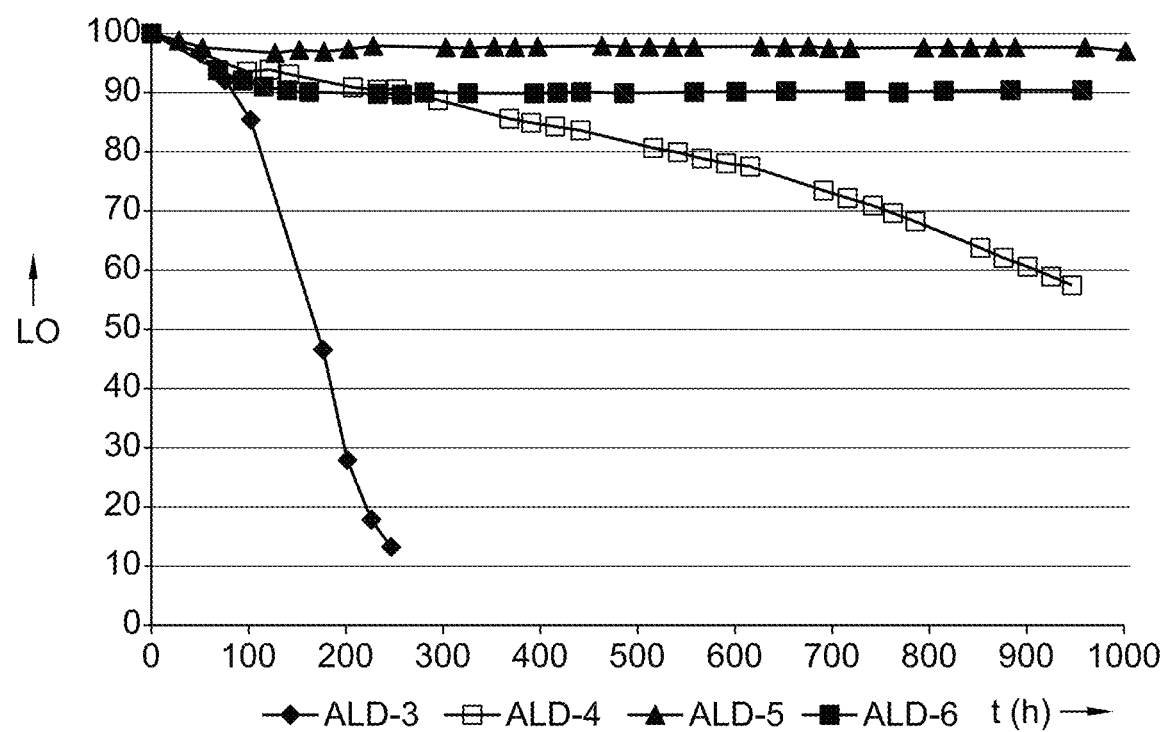
FIG. 4b shows the relative light output (LO) as a function of degradation time given in hours (85° C./100% RH); ALD-3: 20 nm $Al_2O_3$ on $SiO_2$ coating; ALD-4: 20 nm $Al_2O_3$/$Ta_2O_5$ nanolaminate; deposited on thin $SiO_2$ layer (<10 nm); ALD-5: 20 nm $Al_2O_3$/$Ta_2O_5$ nanolaminate; deposited on $SiO_2$ coating; ALD-6: 20 nm $Al_2O_3$/$HfO_2$ nanolaminate; deposited on $SiO_2$ coating.

FIG. 4b shows the relative light output as a function of degradation time given in hours (85° C./100% RH); ALD-3: 20 nm $Al_2O_3$ on $SiO_2$ coating; ALD-4: 20 nm $Al_2O_3/Ta_2O_5$ nanolaminate; deposited on thin $SiO_2$ layer (<10 nm); ALD-5: 20 nm $Al_2O_3/Ta_2O_5$ nano laminate; deposited on $SiO_2$ coating; ALD-6: 20 nm $Al_2O_3/HfO_2$ nano laminate; deposited on $SiO_2$ coating. Amongst others, from these drawings can be concluded that ALD multi-layers of $Al_2O_3$ and a second oxide provide superior behavior over a "simple" $Al_2O_3$ ALD coating. The ALD-3 sample in FIG. 4a is the same as in FIG. 4b; the measurement conditions (temperature) were however different.

Figure 4C:
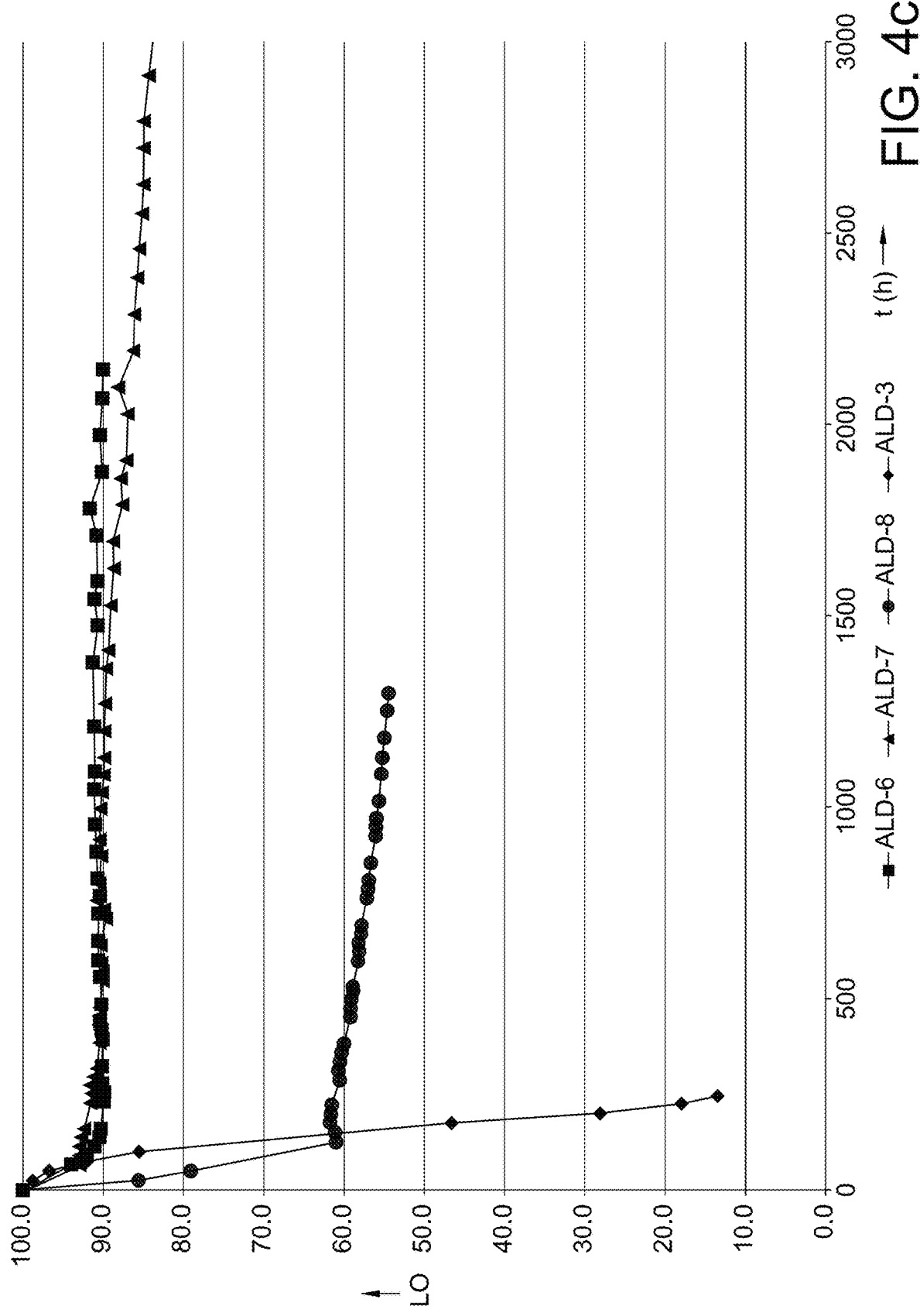
FIG. 4c shows the relative light output (LO) as a function of degradation time given in hours (85° C./100% RH); ALD-3 and ALD-6 samples as described above; ALD-7: 20 nm $Al_2O_3$/$HfO_2$ nanolaminate on thin $SiO_2$ layer (<10 nm), nanolaminate design: 4×[1.5 nm $Al_2O_3$/3.5 nm $HfO_2$]; ALD-8: 10 nm $Al_2O_3$/$HfO_2$ nanolaminate on thin $SiO_2$ layer (<10 nm), nanolaminate design: 2×[1.5 nm $Al_2O_3$/3.5 nm $HfO_2$]. The sol-gel $SiO_2$ coatings in general have a layer thickness in the range of 150-200 nm, unless indicated otherwise. The thin $SiO_2$ layers, indicated with thicknesses <10 nm in general will have a mean layer thickness in the range of about 1-10 nm. The schematic drawings are not necessarily on scale.

FIG. 4c shows the relative light output (LO) as a function of degradation time given in hours (85° C./100% RH); ALD-3 and ALD-6 samples as described above; ALD-7 with 20 nm $Al_2O_3/HfO_2$ nanolaminate on thin $SiO_2$ layer (<10 nm) (nanolaminate design: 4×[1.5 nm $Al_2O_3$/3.5 nm $HfO_2$]) and ALD-8 with 10 nm $Al_2O_3/HfO_2$ nanolaminate on thin $SiO_2$ layer (<10 nm), nanolaminate design: 2×[1.5 nm $Al_2O_3$/3.5 nm $HfO_2$]. It is clear that thicker sol-gel layers and/or more stacked nano laminates provide better results than those with a thin sol-gel layer or a multi-layer stack with only a few layers. ALD-5 and ALD-6 have sol-gel coatings in the range of about 100-200 nm.

EXPERIMENTAL $SiO_2$ Coating of Luminescent Powder

For this experiment, 10 g $SrLiAl_3N_4$:Eu phosphor powder was stirred in 100 ml EtOH in a 3-necked glass flask under constant flow of nitrogen gas. After addition of 100 µl tetramethoxysilane (TMOS) and 15 ml 25% $NH_3$ solution 8.5 g tetraethoxysilane (TEOS) dissolved in 50.4 g EtOH were added and the suspension was stirred for at least 3 hours.

The coated powder was filtered and washed with EtOH. Finally the coated powder was dried for 24 h at 200° C. in air. FIG. 3a shows the SEM image of the $SiO_2$ coated powder after drying showing the surface structure of a single grain.

ALD Coating of $SiO_2$ Coated Luminescent Powder

ALD coatings were made on 5 g scale in a Picosun Oy R150 ALD reactor with a POCA™ sample holder. The following precursor materials were used to deposit either single material ALD coatings ($Al_2O_3$) or multi-layered nanolaminates ($Al_2O_3/Ta_2O_5$, $Al_2O_3/HfO_2$): trimethylaluminum for Al, tris(ethylmethylamido)(tert.-butylimido)tantalum(V) for Ta, tetrakis(ethylmethylamido)hafnium for Hf, and $H_2O$ for O. Pure $Al_2O_3$ coatings of 20 nm and 40 nm thickness were deposited at 300° C. The deposition temperature was lowered to 250° C. to either make 20 nm or 100 nm thick $Al_2O_3/Ta_2O_5$ nanolaminates (n×[5 nm $Al_2O_3$+5 nm $Ta_2O_5$]; n=2 or 10) or 20 nm thick $Al_2O_3/HfO_2$ nanolaminates (4×[1.5 nm $Al_2O_3$+3.5 nm $HfO_2$]). To check for agglomerates, all powders were dry-sieved after ALD coating with a 63 nm POM sieve.

Moisture Stability Test

To test and compare the moisture stability of phosphor powders (with and without ALD coating), phosphor/silicone slurries with 2 vol.-% phosphor were prepared. The homogenous slurries were deposited in a sample holder made of Teflon®. After hardening the silicone at 150° C. in air, the quantum efficiency and absorption at 440 nm were measured and used to calculate the light output LO=A*QE. After the initial measurement, the sample holders were placed in gas-tight glass bottles that also contained some ml deionized water (no direct contact between water and sample, excess water present to prevent complete evaporation). The sealed container was placed in a drying chamber at a temperature between 50-100° C. After typical intervals of ~25 h, degradation was stopped and the samples were removed to measure QE and absorption. The light output relative to t=0 was plotted (FIG. 4a) to describe the hydrolysis related degradation of the phosphor powders.

Further moisture stability tests were performed with different examples of coated material as shown in FIG. 4b. Amongst others, the following particles were prepared, with as luminescent core a nitride luminescent material:

|   | 1st coating | 2nd coating |
|---|---|---|
| 1 | $SiO_2$ | 2x [5 nm $Al_2O_3$/5 nm $Ta_2O_5$], 20 nm total thickness |
| 2 | (<10 nm) | 10x [5 nm $Al_2O_3$/5 nm $Ta_2O_5$], 100 nm total thickness |
| 3 | $SiO_2$ | 2x [5 nm $Al_2O3$/5 nm $Ta_2O_5$], 20 nm total thickness |
| 4 | (~100-200 nm) | 10x [5 nm $Al_2O_3$/5 nm $Ta_2O_5$], 100 nm total thickness |

From amongst others the data on these samples it could be concluded that especially good results may be obtained with a first coating layer of at least 50 nm.

FIG. 3c shows a TEM image of the 3rd sample. On the left, the $AlO_x$/$TaO_x$-multilayer is shown and on the right the $SiO_x$/grain interface. This magnification was the highest possible to use to image the grain's edge: delamination of the interfacial layer like visible in the right image (see accolade) occurred quite quickly. The interfacial layer appears to be oxidized grain material (see EDS results). The bright line in between the grain and the oxidized part of the grain represents less dense (or absence of) material. In the left image, the darker layers correspond with $TaO_x$, whereas the brighter ones correspond with $AlO_x$. The $AlO_x$-layer adjacent to the $SiO_x$-layer can be discerned. A further series of samples was made and tested, similar as described above:

| | |
|---|---|
| ALD-7 | 20 nm Al2O3/HfO2 nanolaminate on thin SiO2 layer (<10 nm), nanolaminate design: 4 x [1.5 nm Al2O3/3.5 nm HfO2] |
| ALD-8 | 10 nm Al2O3/HfO2 nanolaminate on thin SiO2 layer (<10 nm), nanolaminate design: 2 x [1.5 nm Al2O3/3.5 nm HfO2] |
| ALD-9 | 10 nm Al2O3/Ta2O5 nanolaminate on thin SiO2 layer (<10 nm), nanolaminate design: 2 x [5 nm Al2O3/5 nm Ta2O5] |

Experimental results concerning the light output dependence on the time at elevated temperatures and 100% RH are shown in FIG. 4c (see above). With respect to ALD-9, after an initial decrease (see also ALD-5), the time stability is very good. Further, ALD-5 was tested at 100% RH at different temperatures. At about 800 hours, the relative intensities (relative to 0 hours) were about 98% (at 85° C.), about 97% (at 100° C.), and about 92% (at 130° C.). This shows that very stable phosphors have been obtained which can withstand severe conditions, without substantial decrease in intensity.

The invention claimed is:

1. A method for providing luminescent particles with a hybrid coating, the luminescent particles comprising a core of a nitride luminescent material and oxide layer at the surface of the core, the method comprising:

depositing a first coating layer onto the oxide layer of the luminescent particles by application of a sol-gel coating process, thereby providing coated luminescent particles; and depositing a second coating layer onto the coated luminescent particles by application of an atomic layer deposition process using a metal oxide precursor selected from a group of metal oxide precursors of metals selected from the group consisting of Al, Hf, Ta, Zr, Ti and Si, the atomic layer deposition process forming a multilayer comprising alternating layers comprising $Ta_2O_5$ and $Al_2O_3$.

2. The method according to claim 1, wherein the luminescent material selected from the $SrLiAl_3N_4:Eu^{2+}$ class.

3. The method according to claim 1, wherein the sol-gel coating process comprises:

providing a mixture of an alcohol, ammonia, water, the luminescent particles and a metal alkoxide precursor while agitating the mixture, and allowing the first coating to be formed on the luminescent particles, wherein the metal alkoxide precursor is selected from the group consisting of a titanium alkoxide, a silicon alkoxide, and an aluminum alkoxide; and retrieving the luminescent particles from the mixture and subjecting the luminescent particles to a heat treatment to provide the coated luminescent particles.

4. The method according to claim 1, wherein in the sol-gel coating process a silicon alkoxide precursor is used, wherein the silicon alkoxide precursor is selected from the group of compounds consisting of:

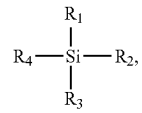

wherein R1, R2, R3 are selected from the group consisting of hydrolysable alkoxy moieties and R4 is selected from the group consisting of C1-C6 linear alkyl moieties, hydrolysable alkoxy moieties, and a phenyl moiety.

5. The method according to claim 4, wherein the silicon alkoxide precursor is selected from the group consisting of

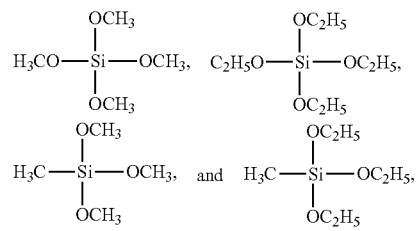

and wherein in the atomic layer deposition process a metal oxide precursor selected from the group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]_4$, $TaCl_5$, $Ta(N(CH_3)_2)_5$, $Ta\{[N(CH_3)(CH_2CH_3)]_3N(C(CH_3)_3)\}$, $ZrCl_4$, $Zr(N(CH_3)_2)_4$, $TiCl_4$, $Ti(OCH_3)_4$, $Ti(OCH_2CH_3)_4$, $SiCl_4$, $H_2N(CH_2)_3Si(OCH_2CH_3)_3$, and $Si(OCH_2CH_3)_4$, and an oxygen source selected from the group consisting of $H_2O$ and $O_3$ are applied.

6. The method of claim 1 wherein depositing the first coating layer comprises depositing the first coating layer having a first coating layer thickness (d1) in a range of about 20 nm to about 500 nm; and wherein depositing the second coating layer comprises depositing the second coating layer having a second coating layer thickness (d2) in a range of about 5 nm to about 250 nm.

7. The method of claim 1, wherein the luminescent particles are smaller than 1 micron.

8. A method for providing luminescent particles with a hybrid coating, the luminescent particles comprising a core of a nitride luminescent material and oxide layer at the surface of the core, the method comprising:
   depositing a first coating layer onto the oxide layer of the luminescent particles by application of a sol-gel coating process, thereby providing coated luminescent particles; and
   depositing a second coating layer onto the coated luminescent particles by application of an atomic layer deposition (ALD) process, the atomic layer deposition process forming a multilayer comprising alternating layers, the alternating layers comprising a first ALD layer comprising $Al_2O_3$ and a second ALD layer comprising a metal oxide selected from a group consisting of $Ta_2O_5$, $ZrO_2$, $TiO_2$, $Y_2O_3$, $Nb_2O_5$, and $HfO_2$.

9. The method of claim 8 wherein the second ALD layer comprises a metal oxide selected from a group consisting of $Ta_2O_5$, $HfO_2$ and $ZrO_2$.

10. The method of claim 9 wherein a thickness of each of the first and second ALD layers is less than 10 nm.

11. The method of claim 10 wherein the luminescent material is selected from the $SrLiAl_3N_4:Eu^{2+}$ class.

12. The method of claim 10 wherein depositing the first coating layer comprises depositing the first coating layer having a first coating layer thickness (d1) at least 50 nm; and wherein depositing the second coating layer comprises depositing the second coating layer having a second coating layer thickness (d2) in a range of about 5 nm to about 250 nm.

13. The method of claim 8 wherein the second ALD layer comprises $Ta_2O_5$.

14. The method of claim 8 wherein the second ALD layer comprises $HfO_2$.

15. The method of claim 8 wherein a thickness of each of the first and second ALD layers is less than 10 nm.

16. The method of claim 15 wherein the luminescent material is selected from the $SrLiAl_3N_4:Eu^{2+}$ class.

17. The method of claim 15 wherein depositing the first coating layer comprises depositing the first coating layer having a first coating layer thickness (d1) at least 50 nm; and wherein depositing the second coating layer comprises depositing the second coating layer having a second coating layer thickness (d2) in a range of about 5 nm to about 250 nm.

18. The method of claim 8 wherein the luminescent material is selected from the $SrLiAl_3N_4:Eu^{2+}$ class.

19. The method of claim 8 wherein depositing the first coating layer comprises depositing the first coating layer having a first coating layer thickness (d1) at least 50 nm; and wherein depositing the second coating layer comprises depositing the second coating layer having a second coating layer thickness (d2) in a range of about 5 nm to about 250 nm.

* * * * *